(12) United States Patent
Tang et al.

(10) Patent No.: US 9,179,547 B2
(45) Date of Patent: Nov. 3, 2015

(54) GOLD FINGER AND TOUCH SCREEN

(71) Applicant: SHENZHEN O-FILM TECH CO., LTD, Shenzhen (CN)

(72) Inventors: Genchu Tang, Shenzhen (CN);
Shengcai Dong, Shenzhen (CN); Wei Liu, Shenzhen (CN); Bin Tang, Shenzhen (CN)

(73) Assignee: Shenzhen O-film Tech Co., Ltd., Guangdong (CN)

( * ) Notice: Subject to any disclaimer, the term of this patent is extended or adjusted under 35 U.S.C. 154(b) by 152 days.

(21) Appl. No.: 13/968,331

(22) Filed: Aug. 15, 2013

(65) Prior Publication Data

US 2014/0290991 A1 Oct. 2, 2014

Related U.S. Application Data

(63) Continuation of application No. PCT/CN2013/079164, filed on Jul. 10, 2013.

(30) Foreign Application Priority Data

Mar. 30, 2013 (CN) .......................... 2013 1 0110313

(51) Int. Cl.
*G06F 1/16* (2006.01)
*H05K 1/11* (2006.01)
(Continued)

(52) U.S. Cl.
CPC ............... *H05K 1/117* (2013.01); *G06F 3/041* (2013.01); *H05K 3/1258* (2013.01); *H05K 2201/0108* (2013.01); *H05K 2201/026* (2013.01); *H05K 2201/0376* (2013.01)

(58) Field of Classification Search
CPC ............. H05K 3/10; H05K 3/12; H05K 1/11; H05K 3/09; G06F 1/1643; G06F 3/041; G06F 3/044; B32B 3/30; H01H 1/06

USPC ................ 174/257, 258, 18.06, 261; 29/846; 345/173; 349/12; 427/125, 97.3, 97.4; 216/13; 428/40.1, 41.7, 41.8, 42.1, 428/156, 220, 343, 353, 358; 200/270
See application file for complete search history.

(56) References Cited

U.S. PATENT DOCUMENTS 6,246,014 B1 * 6/2001 Pommer ........................ 174/261
2008/0179731 A1 7/2008 Fan ............................. 257/690
(Continued)

FOREIGN PATENT DOCUMENTS

CN 1355907 A 6/2002
CN 101615096 A 12/2009
(Continued)

OTHER PUBLICATIONS

3mtm-anisotropic-conductive-film-7303.*
(Continued)

*Primary Examiner* — Timothy Thompson
*Assistant Examiner* — Guillermo Egoavil
(74) *Attorney, Agent, or Firm* — J.C. Patents

(57) ABSTRACT

A gold finger, includes a substrate, an embossable adhesive layer and a plurality of wires. The gold finger is achieved through adhering an embossable adhesive layer to a side of the substrate, providing grid-shaped grooves on a side of the embossable adhesive layer away from the substrate, embedding conductive grids of the wires in the grooves to form the wires. The gold finger is disposed on a sensing component, the wires of the gold finger are electrically connected with a circuit board through an anisotropic conductive adhesive. The contact area of the wire and the embossable adhesive layer is increased through embedding the conductive grid of the wire, which is grid-shaped structure, in the grooves such that the wires are tightly combined to the embossable adhesive layer and not easy to fall off or be scratched. The present invention further provides a touch screen containing the gold finger.

17 Claims, 3 Drawing Sheets

(51) Int. Cl.
*G06F 3/041* (2006.01)
*H05K 3/12* (2006.01)

(56) References Cited

U.S. PATENT DOCUMENTS

| | | | |
|---|---|---|---|
| 2009/0236740 | A1 | 9/2009 | Wu .................... 257/737 |
| 2012/0105356 | A1* | 5/2012 | Brosnan et al. ......... 345/174 |
| 2012/0146919 | A1* | 6/2012 | Kim et al. ............. 345/173 |
| 2012/0256642 | A1* | 10/2012 | Badaye et al. ........... 324/658 |
| 2013/0047428 | A1* | 2/2013 | Ra .................... 29/846 |
| 2013/0057497 | A1* | 3/2013 | Cho et al. ............. 345/173 |
| 2014/0218635 | A1* | 8/2014 | Gao et al. ............. 349/12 |

FOREIGN PATENT DOCUMENTS

| | | |
|---|---|---|
| CN | 201638190 U | 11/2010 |
| CN | 101907906 A | 12/2010 |
| CN | 201788495 U | 4/2011 |
| CN | 202190460 U | 4/2012 |
| CN | 102510681 A | 6/2012 |
| CN | 102722279 A | 10/2012 |
| CN | 102762040 A | 10/2012 |
| CN | 102903423 A | 1/2013 |
| CN | 102930922 A | 2/2013 |
| CN | 203178973 U | 9/2013 |
| CN | 103412663 B | 10/2014 |
| JP | 2003-216339 A | 7/2003 |
| KR | 10-2012-0018059 A | 2/2012 |
| KR | 20120018059 A * | 2/2012 ............. G06F 3/044 |
| KR | 10-2013-0023663 A | 3/2013 |
| TW | 201126390 A1 | 8/2011 |
| TW | M441193 U1 | 11/2012 |
| WO | WO 2011/062301 A1 | 5/2011 |

OTHER PUBLICATIONS

Chinese International Search Report of corresponding International PCT Application No. PCT/CN2013/079164, dated Jan. 9, 2014.
Chinese First Examination Report of corresponding China Application No. 201310110313.8, dated Feb. 14, 2014.
Korean Examination Report of corresponding Republic of Korea patent application No. 10-2013-7026485, dated Sep. 30, 2014.
Taiwan Examination Report and search report of corresponding Taiwan patent application No. 102130449, dated Feb. 24, 2015.

* cited by examiner

GOLD FINGER AND TOUCH SCREEN

CROSS-REFERENCE TO RELATED APPLICATIONS

This application is a continuation of International Application No. PCT/CN2013/079164, filed on Jul. 10, 2013, which claims the priority benefit of China Patent Application No. 201310110313.8, filed on Mar. 30, 2013, both of which are hereby incorporated by reference in their entireties.

FIELD OF THE INVENTION

The present invention relates to the field of touch screen technology, in particular to a gold finger and a touch screen.

BACKGROUND OF THE INVENTION

A touch screen is an inductive device able to receive an input signal such as a touch etc. The touch screen is a brand new information interaction device that gives information interaction a new look. The development of touch screen technique has attracted extensive attention in information media at home and abroad. A conductive layer of the touch screen is electrically connected with a Flexible Printed Circuit Board (FPCB) through an electrode lead. A part of the electrode lead located at a distal end thereof is referred to as a gold finger.

At present, the gold finger is silver needle wires formed through a silk screen printing, or achieved by dividing pre-printed silver paste at whole connecting area through laser. Since the gold finger made through above two means involves coating silver paste on the surface of the conductive layer, the gold finger tends to fall off or be scratched, thereby deteriorating the conductivity of the gold finger and the performance of the touch screen.

SUMMARY OF THE INVENTION

On the basis of this, it is necessary to provide a gold finger and a touch screen for the problem of scratch and drop of the gold finger, thus improving the performance.

A gold finger, includes a substrate, and further includes an embossable adhesive layer and a plurality of wires which can be electrically connected with a circuit board, the embossable adhesive layer is adhered to a side of the substrate, grid-shaped grooves are provided on a side of the embossable adhesive layer away from the substrate, the wires include conductive grids embedded in the grooves.

In one of the embodiments, a thickness of the wires is equal to or less than a depth of the grooves.

In one of the embodiments, the conductive grid of the wires is formed by curing a conductive material filled in the groove, the conductive material is metal, graphene, conductive macromolecule, carbon nanotube or indium tin oxide.

In one of the embodiments, the wires can be electrically connected with the circuit board through anisotropic conductive adhesive which includes a plurality of conductive spheres, a diameter of a maximum circle of an area surrounded by a grid unit is less than an average of distances between each two adjacent conductive spheres.

In one of the embodiments, the diameter of the maximum circle of the grid unit is equal to or less than 50 μm, and is equal to or larger than 5 μm.

In one of the embodiments, the embossable adhesive layer is adhered on the surface of the substrate, where the surface has been pretreated by a plasma.

A touch screen, includes a sensing component, a circuit board and an anisotropic conductive adhesive including a plurality of conductive spheres, and further includes a gold finger, the gold finger is disposed on the sensing component, wires of the gold finger can be electrically connected with the circuit board through the conductive spheres of the anisotropic conductive adhesive.

In one of the embodiments, a diameter of the conductive sphere is equal to or larger than a diameter of a maximum circle of an area surrounded by a grid unit, and is equal to or less than 1.2 times of the diameter of the maximum circle of the area surrounded by the grid unit.

For the above gold finger and touch screen, the gold finger is achieved through adhering an embossable adhesive layer on a side of a substrate, providing grid-shaped grooves on a side of the embossable adhesive layer away from the substrate, embedding a conductive grid in the groove to form a wire. The gold finger is disposed on a sensing component, the wires of the gold finger are electrically connected with the circuit board through an anisotropic conductive adhesive. In this manner, the contact area of the wire and the embossable adhesive layer is increased through embedding the conductive grid of the wire, which is grid-shaped structure, in the grooves such that the wires are tightly combined to the embossable adhesive layer and not easy to fall off or be scratched. Therefore, the conductivity of the gold finger is ensured and the performance of the touch screen is improved.

DETAILED DESCRIPTION OF THE EMBODIMENTS

In order to understand the present invention, more comprehensive description of the present invention will be given with reference to the accompany drawings. The drawings give preferred embodiments of the present invention. However, the present invention can be realized through various manners, and is not limited to the embodiments described herein. On the contrary, the aim of providing these embodiments is to make the disclosure of the present invention more clear and comprehensive.

Figure 1:
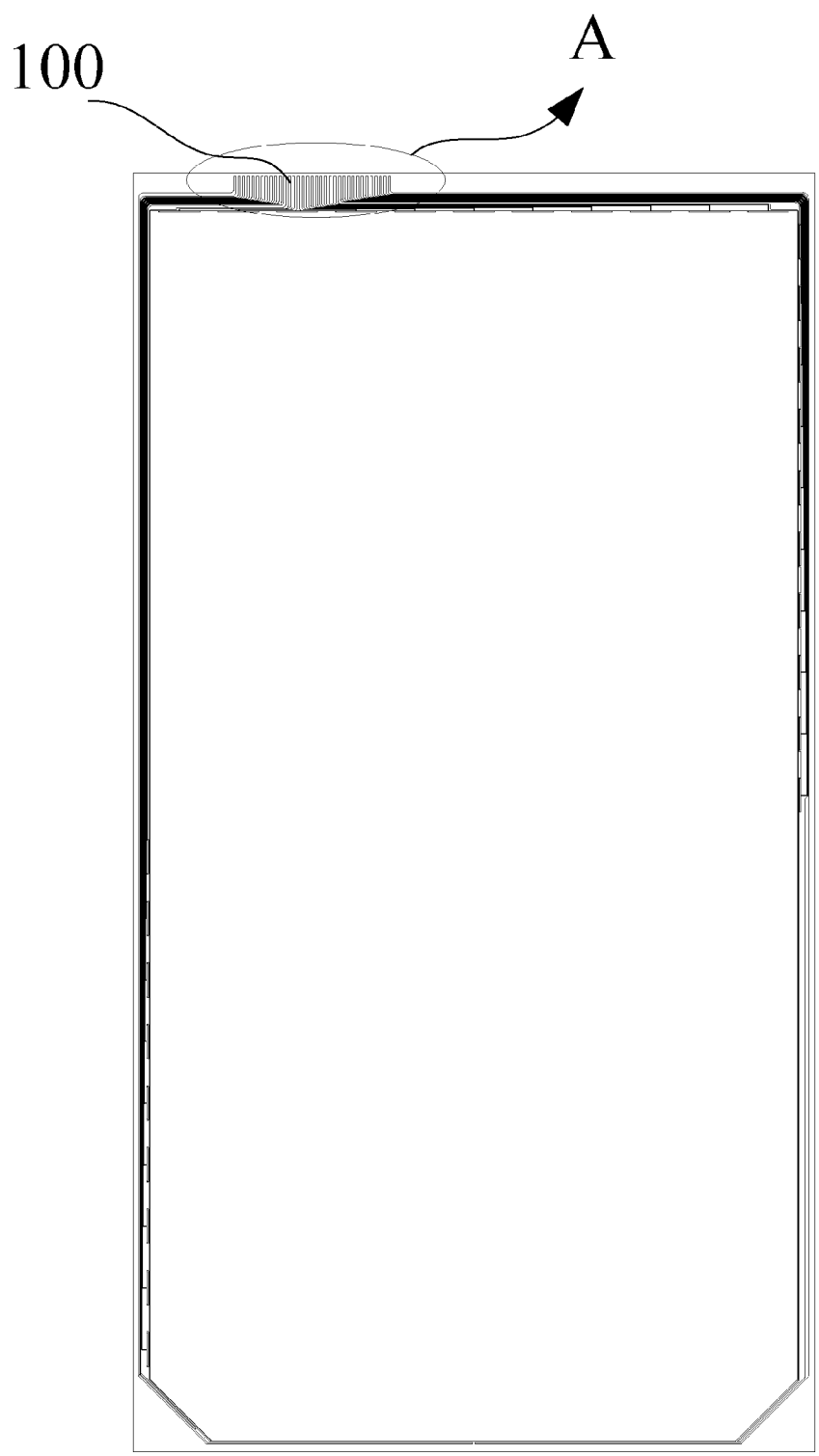
FIG. 1 is a schematic structural diagram of a touch screen containing a gold finger according to an embodiment of the present invention.
Figure 2:
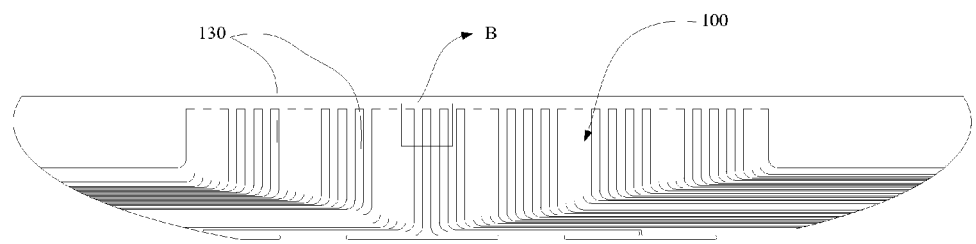
FIG. 2 is an enlarged schematic structural diagram of A portion in FIG. 1.
Figure 3:
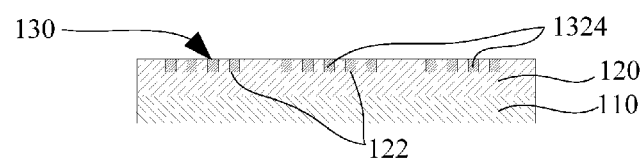
FIG. 3 is another view of structural schematic diagram of B portion in FIG. 2.
Figure 4:
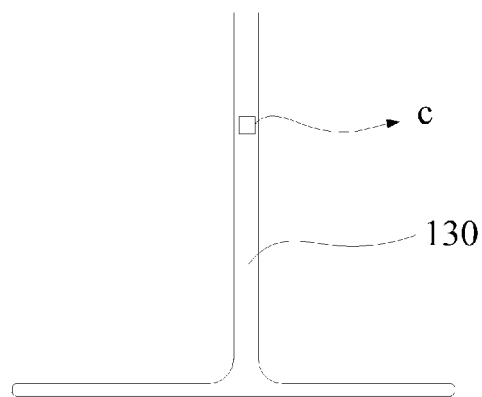
FIG. 4 is a structural schematic diagram of a wire of the gold finger shown in FIG. 1.

In an embodiment as shown in FIGS. 1, 2 and 3, a gold finger 100, includes a substrate 110, an embossable adhesive layer 120, and a plurality of wires 130 which can be electrically connected with a circuit board. The embossable adhesive layer 120 is adhered to a side of the substrate 110. A plurality of grid-shaped grooves 122 are defined in a side of the embossable adhesive layer 120 away from the substrate 110. The wires 130 include conductive grids 132 embedded in the grooves 122. For example, each of the wires 130 can be formed by a conductive grid 132 embedded in a corresponding groove 122. It is also possible that some of the wires 130 are formed by conductive grid 132 while other wires 130 are solid lines.

For the above gold finger 100, the gold finger 100 is achieved through coating an adhesive material on a side of the substrate 110 to form the embossable adhesive layer 120, forming the grid-shaped grooves 122 on a side of the embossable adhesive layer 120 away from the substrate 110, embedding the conductive grid 132 of the wire 130 in the groove 122 to form the wire 130. The gold finger 100 is disposed on a sensing component, and electrically connected with the circuit board through an anisotropic conductive adhesive. The contact area of the wire 130 and the embossable adhesive layer 120 is increased through embedding the conductive grid 132 of the wire 130, which is grid-shaped structure, in the grooves 122 such that the wires 130 are tightly combined to the embossable adhesive layer 122 and not easy to fall off or be scratched. Therefore, the conductivity of the gold finger 100 is ensured, and the performance of the touch screen is improved.

Based on above description, the material of the substrate 110 can be glass, acrylic-based resin, polyethylene terephthalate, or polycarbonate plastics etc, a transparent insulating material is the best choice. The thickness of the substrate 110 is ranged from 25 μm to 1 mm. In order to ensure the light transmitting effect of the product including the substrate 110, the thickness of the substrate 110 is preferable to be ranged from 50 μm to 0.7 mm.

Based on above description, the material of the embossable adhesive layer 120 can be thermoplastic polymers, thermosetting polymers, UV curing polymers etc. The thickness of the embossable adhesive layer 120 is ranged from 1 μm to 10 μm, in order to ensure the light transmitting effect of the product including the embossable adhesive layer 120, the thickness of the embossable adhesive layer 120 is preferable to be ranged from 2 μm to 5 μm.

Please refer to FIG. 3, in one of the embodiments, the thickness of the wire 130 is equal to or less than the depth of the groove 122, thus the conductive material of the wire 130 will not go beyond the plane of the opening of the groove 122, which provides additional protection for the wire 130, to protect the wire 130 from easily falling off or being scratched. Therefore, the conductivity of the gold finger 100 is ensured and the performance of the touch screen is improved.

Please refer to FIG. 3, in one of the embodiments, the conductive grid 132 of the wire 130 is formed by curing the conductive material filled in the groove 122. Specifically, the grid-shaped groove 122 is embossed through an embossing mould on a side of the embossable adhesive layer 120 away from the substrate 110, and the conductive material is filled in the groove 122 through blade coating process, and then sintered to form the conductive grid 132, and the wire 130. The conductive material is filled into the groove 122 to form a plurality of metal threads 1324, and the conductive grid 132 is formed through the metal threads intersecting with each other according to the shape of the groove 122. Benefit from the grid-shaped structure, the wires 130 are tightly adhered to the embossable adhesive layer 120 and not easy to fall off or be scratched. Therefore, the conductivity of the gold finger 100 is ensured, and the performance of the touch screen is improved.

Based on the description above, the conductive material filled into the groove 122 will form a plurality of metal threads 1324, these metal threads 1324 will intersect with each other to form the conductive grid 132. The conductive grid 132 includes a plurality of grid units 1320.

Based on the description above, in order to ensure the conductivity of the wire 130, the thickness of the metal wire 1324 which is formed by filling the conductive material into the grid-shaped groove 122 should be reasonably ranged from 1 μm to 10 μm, the width of the metal wire 1324 can be reasonably ranged from 0.5 μm to 5 μm. In addition to ensure the conductivity of the wire 130, due to the gold finger including a plurality of wires 130, in order to facilitate the structure design and arrangement of the wire 130, the thickness of the metal wire 1324 can be further reasonably ranged from 2 μm to 5 μm, the width of the metal wire 1324 can be reasonably ranged from 2 μm to 5 μm.

Based on the description above, the conductive material of the wire 130 can be metal, graphene, conductive macromolecule, carbon nanotube or indium tin oxide. Specifically, the conductive material can be gold, silver, copper, aluminum, nickel, zinc, or alloy containing at least two of them. Since these metal materials are relatively cheap, the cost can be reduced. In this embodiment, the conductive material is silver.

Figure 5:
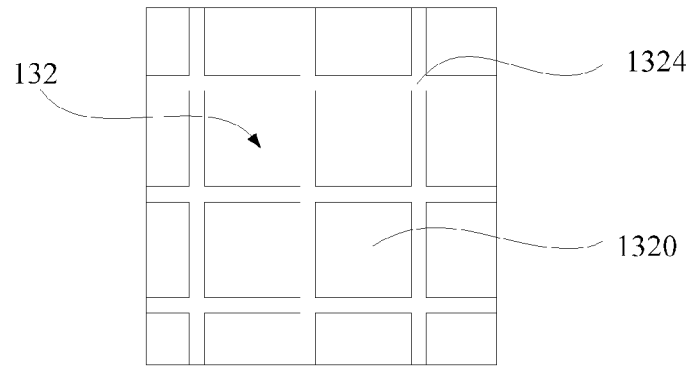
FIG. 5 is an enlarged schematic structural diagram of C portion in FIG. 4.

Based on description above, the conductive grid 132 includes a plurality of grid units 1320. According to different requirements of the grid pattern, all grid units 1320 of the conductive grid 132 can be the same, that is, the conductive grid 132 is a regular conductive grid 132. Specifically, the grid unit 1320 can be of regular polygon such as square, rhombus, regular hexagon etc. In the embodiment shown in FIG. 5, the grid unit 1320 is of square. In another embodiment shown in FIG. 6, the grid unit 1320 is rhombus.

Figure 7:
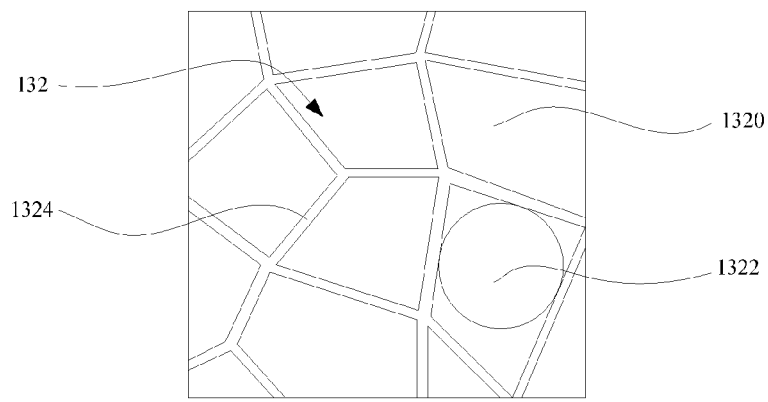
FIG. 7 is an enlarged schematic structural diagram of C portion in FIG. 4 according to still another embodiment.

In still another embodiment shown in FIG. 7, grid units 1320 of at least two of the conductive grids 132 are different, that is, the conductive grid 132 is an irregular conductive grid 132.

Please refer to FIG. 2, in one of the embodiments, the embossable adhesive layer 120 is adhered to a surface of the substrate 110, which is pretreated through plasma. Specifically, plasma pretreatment is performed on a surface of the substrate, before an adhesive material being coated on the surface and then being cured to form the embossable adhesive layer 120, such that smudginess such as greasy dirt of the surface of the substrate 110 can be removed. Additionally, the surface of the substrate 110 is ionized, thus enhancing the bonding strength between the embossable adhesive layer 120 and the surface of the substrate 110. It should be noted that, even if plasma pretreating is not performed, the purpose of adhering the embossable adhesive layer 120 to the substrate 110 can also be achieved.

Figure 6:
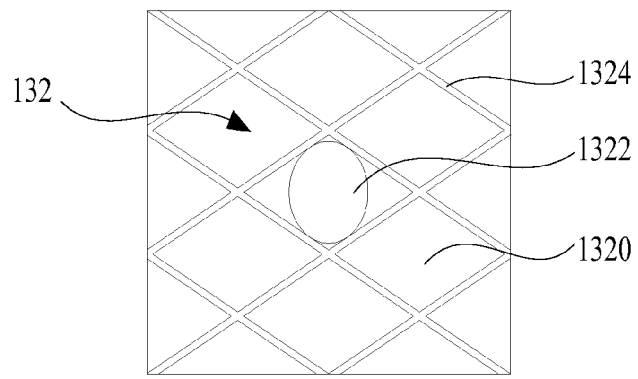
FIG. 6 is an enlarged schematic structural diagram of C portion in FIG. 4 according to another embodiment.

Please refer to FIG. 6, in one of the embodiments, the wire 130 can be electrically connected with the circuit board through an anisotropic conductive adhesive, the anisotropic conductive adhesive includes a plurality of conductive spheres. The diameter of the maximum circle 1322 of each of the grid units 1320 is less than an average of the distances between each two adjacent conductive spheres. The anisotropic conductive adhesive includes a plurality of conductive spheres, and a circuit board is connected with the wire 130 of the gold finger 100 by these conductive spheres of the anisotropic conductive adhesive. In order to guarantee the conductive spheres being sufficiently connected with the circuit board, and the wire 130 of the gold finger 100, and prevent the conductive spheres from totally falling into the area surrounded by the grid units 1320 and thus not contacting the circuit board, the diameter of the maximum circle 1322 of each of the grid units 1320 should be less than the average of the distances between each two adjacent conductive spheres.

Based on the description above, the connectivity of the anisotropic conductive adhesive is realized by the conductive particle connecting the electrodes of IC chip and the substrate 110, and at the same time short circuit is avoided between the two adjacent electrodes, thus achieving the aim of electrical connection in a single direction. In this embodiment, the wire 130 is connected electrically with the circuit board by the anisotropic conductive adhesive, thus guaranteeing that the gold finger 100 is conductive in a specific direction, and avoiding short circuit during electrical connection.

Specifically, the conductive spheres of the anisotropic conductive adhesive are generally fractured through heat and high pressure treatment, the conductive spheres are randomly distributed in the anisotropic conductive adhesive, it is shown in the histogram of distance distribution that, the average distance of each two adjacent conductive spheres is about 50 µm, hence, in order to guarantee the conductive spheres being sufficiently connected with the circuit board, and the wire 130 of the gold finger 100, the diameter of the maximum circle 1322 of the grid unit 1320 should be equal to or less than 50 µm. Due to the grid units 1320 being formed by embossing, in order to guarantee the forming effect and satisfy the requirement of the process, the diameter of the maximum circle 1322 of each of the grid units 1320 should be equal to or larger than 5 µm.

A touch screen as shown in FIGS. 1, 2 and 3, includes a sensing component, a circuit board and an anisotropic conductive adhesive including a plurality of conductive spheres, and a gold finger 100, the gold finger 100 is disposed on the sensing component, a wire 130 of the gold finger can be electrically connected with the circuit board through the conductive spheres of the anisotropic conductive adhesive.

For the touch screen above, the gold finger 100 is achieved through coating an adhesive material on a side of a substrate 110 to form an embossable adhesive layer 120, forming grid-shaped grooves 122 on a side of the embossable adhesive layer 120 away from the substrate 110, embedding the conductive grid 132 of the wire 130 in the grooves 122 to form the wire 130. The gold finger 100 is disposed on the sensing component and electrically connected with the circuit board through the conductive spheres of the anisotropic conductive adhesive, thus the sensing component is electrically connected with the circuit board. The contact area of the wire 130 and the embossable adhesive layer 122 is increased through embedding the conductive grid 132 of the wire 130, which is a grid-shaped structure, in the grooves 122 such that the wires 130 are tightly combined to the embossable adhesive layer 122 and not easy to fall off or be scratched. Therefore, the conductivity of the gold finger 100 is ensured, and the performance of the touch screen is improved.

Where, the anisotropic conductive adhesive is formed by adhering a plurality of conductive spheres to an adhesive tape. The wire 130 is connected electrically with the circuit board by the anisotropic conductive adhesive, thus guaranteeing the gold finger 100 being conductive in a specific direction, and avoiding short circuit during the electrical connection.

Please refer to FIG. 6, in one of the embodiments, the diameters of the conductive spheres are equal to or larger than the diameter of the maximum circle 1322 of the area surrounded by each of the grid units 1320, and is equal to or less than 1.2 times of the diameter of a maximum circle 1322 of the area surrounded by the grid unit 1320. The gold finger 100 is electrically connected with the circuit board through the conductive spheres of the anisotropic conductive adhesive, specifically, the anisotropic conductive adhesive is pressed and adhered to the gold finger 100. Due to the wires 130 of the gold finger 100 being a grid-shaped structure, if the grid unit 1320 is too small, the metal wire 1324 may break during pressing and adhering, thus impacting the conductivity of the gold finger 100. If the grid unit 1320 is too large, the conductive spheres may fall into the area surrounded by the grid unit 1320, such that the conductive spheres cannot overlap with the metal wire 1324, thus no electrical connection is established therebetween, hence, the diameter of the conductive sphere should be equal to or larger than the diameter of the maximum circle 1322 of the area surrounded by the grid unit 1320, and is equal to or less than 1.2 times of the diameter of a maximum circle 1322 of the area surrounded by the grid unit 1320.

Specifically, the conductive sphere of the anisotropic conductive adhesive is generally fractured through heat and high pressure treatment, the conductive spheres are randomly distributed in the anisotropic conductive adhesive, it is shown in the histogram of distance distribution that, the average distance of each two adjacent conductive spheres is about 50 µm, hence, in order to guarantee the conductive spheres being sufficiently connected with the circuit board, and the wire 130 of the gold finger 100, the diameter of the maximum circle 1322 of the grid unit 1320 should be equal to or less than 50 µm. Due to the grid units 1320 being formed by embossing, in order to guarantee the forming effect and satisfy the requirement of the process, the diameter of the maximum circle 1322 of each of the grid units 1320 should be equal to or larger than 5 µm.

The above embodiments only describe several implementing modes of the present invention with specific details, but they should not be understood as limiting the scope of the present invention. It should be noted that, for those skilled in the art, they can make multiple modifications and improvements without separating from the spirit of the present invention, which should all fall within the protection scope of the present invention. Therefore, the protection scope of the present invention should be subject to the claims.

The invention claimed is:

1. A gold finger, comprising a substrate, wherein the gold finger further comprises an embossable adhesive layer and a plurality of wires which can be electrically connected with a circuit board, the embossable adhesive layer is adhered to a side of the substrate, a plurality of grid-shaped grooves are provided on a side of the embossable adhesive layer away from the substrate, the wires comprise conductive grids embedded in the grooves;
   wherein the conductive grids of the wires are formed by curing a conductive material filled in the grooves, the conductive material is metal, graphene, conductive macromolecule, carbon nanotube or indium tin oxide;
   wherein the wires can be electrically connected with the circuit board through an anisotropic conductive adhesive which comprises a plurality of conductive spheres, a diameter of a maximum circle in an area surrounded by a grid unit is less than an average of distances between each two adjacent conductive spheres.

2. The gold finger according to claim 1, wherein a thickness of the wires is equal to or less than a depth of the grooves.

3. The gold finger according to claim 1, wherein the diameter of the maximum circle of the grid unit is equal to or less than 50 µm, and is equal to or larger than 5 µm.

4. The gold finger according to claim 1, wherein the embossable adhesive layer is adhered on the surface of the substrate, wherein the surface has been pretreated by a plasma.

5. The gold finger according to claim 2, wherein the embossable adhesive layer is adhered on the surface of the substrate, wherein the surface has been pretreated by a plasma.

6. The gold finger according to claim 1, wherein the embossable adhesive layer is adhered on the surface of the substrate, wherein the surface has been pretreated by a plasma.

7. The gold finger according to claim 1, wherein the embossable adhesive layer is adhered on the surface of the substrate, wherein the surface has been pretreated by a plasma.

8. The gold finger according to claim 3, wherein the emboss able adhesive layer is adhered on the surface of the substrate, wherein the surface has been pretreated by a plasma.

9. A touch screen, comprising a sensing component, a circuit board and an anisotropic conductive adhesive comprising a plurality of conductive spheres, and a gold finger disposed on the sensing component, wherein the gold finger comprises a substrate, an embossable adhesive layer and a plurality of wires which are electrically connected with the circuit board through the conductive spheres of the anisotropic conductive adhesive, the embossable adhesive layer is adhered to a side of the substrate, grid-shaped grooves are provided on a side of the embossable adhesive layer away from the substrate, the wires comprise conductive grids embedded in the grooves;

wherein the conductive grids of the wires are formed by curing a conductive material filled in the grooves, the conductive material is metal, graphene, conductive macromolecule, carbon nanotube or indium tin oxide;

wherein the wires can be electrically connected with the circuit board through an anisotropic conductive adhesive which comprises a plurality of conductive spheres, a diameter of a maximum circle in an area surrounded by a grid unit is less than an average of distances between each two adjacent conductive spheres.

10. The touch screen according to claim 9, wherein a thickness of the wires is equal to or less than a depth of the grooves.

11. The touch screen according to claim 9, wherein the diameter of the maximum circle of the grid unit is equal to or less than 50 μm, and is equal to or larger than 5 μm.

12. The touch screen according to claim 9, wherein the embossable adhesive layer is adhered on the surface of the substrate, wherein the surface has been pretreated by a plasma.

13. The touch screen according to claim 9, wherein a diameter of the conductive sphere is equal to or larger than a diameter of a maximum circle of an area surrounded by a grid unit of the wires, and is equal to or less than 1.2 times of the diameter of the maximum circle of the area surrounded by the grid unit of the wires.

14. A touch screen, comprising a sensing component, a circuit board and an anisotropic conductive adhesive comprising a plurality of conductive spheres, and a gold finger disposed on the sensing component, wherein the gold finger comprises a substrate, an embossable adhesive layer and a plurality of wires which are electrically connected with the circuit board through the conductive spheres of the anisotropic conductive adhesive, the embossable adhesive layer is adhered to a side of the substrate, grid-shaped grooves are provided on a side of the embossable adhesive layer away from the substrate, the wires comprise conductive grids embedded in the grooves;

wherein a diameter of the conductive sphere is equal to or larger than a diameter of a maximum circle of an area surrounded by a grid unit of the wires, and is equal to or less than 1.2 times of the diameter of the maximum circle of the area surrounded by the grid unit of the wires.

15. The touch screen according to claim 14, wherein a thickness of the wires is equal to or less than a depth of the grooves.

16. The touch screen according to claim 14, wherein the diameter of the maximum circle of the grid unit is equal to or less than 50 μm, and is equal to or larger than 5 μm.

17. The touch screen according to claim 14, wherein the embossable adhesive layer is adhered on the surface of the substrate, wherein the surface has been pretreated by a plasma.

* * * * *